(12) United States Patent
Tsai et al.

(10) Patent No.: US 8,783,899 B2
(45) Date of Patent: Jul. 22, 2014

(54) LIGHT BAR ASSEMBLY (71) Applicant: Lextar Electronics Corporation, Hsinchu (TW)

(72) Inventors: Ming-Hua Tsai, Chiayi (TW); Chen-I Lu, Shuishang Township, Chiayi County (TW)

(73) Assignee: Lextar Electronics Corporation, Hsinchu (TW)

( * ) Notice: Subject to any disclaimer, the term of this patent is extended or adjusted under 35 U.S.C. 154(b) by 57 days.

(21) Appl. No.: 13/688,983

(22) Filed: Nov. 29, 2012

(65) Prior Publication Data
US 2013/0215610 A1 Aug. 22, 2013

(30) Foreign Application Priority Data

Feb. 21, 2012 (TW) .............................. 101105600 A (51) Int. Cl.
F21S 4/00 (2006.01)
F21V 21/00 (2006.01)
F21V 31/00 (2006.01)

(52) U.S. Cl.
CPC .................. F21V 21/00 (2013.01); F21V 31/00 (2013.01); Y10S 362/80 (2013.01)
USPC .................. 362/225; 362/249.02; 362/249.01; 362/800

(58) Field of Classification Search
CPC .................................. F21V 21/00; F21V 31/00
USPC .............. 362/249.01, 249.02, 249.1, 249.11, 362/800, 225
See application file for complete search history.

(56) References Cited

U.S. PATENT DOCUMENTS

| 7,703,941 B2 * | 4/2010 | Lee ................................ 362/219 |
| 7,771,107 B2 * | 8/2010 | Lung et al. ..................... 362/634 |
| 7,926,977 B2 * | 4/2011 | Nall et al. ................. 362/249.02 |
| 8,523,391 B2 * | 9/2013 | Ishizuka et al. .......... 362/249.02 |
| 2012/0092875 A1 * | 4/2012 | Cho et al. ................. 362/311.01 |
| 2013/0215614 A1 * | 8/2013 | Gulden ..................... 362/249.02 |
| 2013/0229796 A1 * | 9/2013 | Tseng et al. .................... 362/225 |

* cited by examiner

Primary Examiner — Anabel Ton
(74) Attorney, Agent, or Firm — Muncy, Geissler, Olds & Lowe, P.C.

(57) ABSTRACT

A first substrate of a light bar assembly includes a first edge and a second edge parallel to each other along a first direction. A first connecting end includes a first connecting portion protruding further outward than a second connecting portion. A first bonding pad and a second bonding pad are disposed on the first substrate. First solid-state semiconductor light sources are disposed along the first edge and the second edge. A second substrate, disposed corresponding to the first substrate, includes a third edge, a fourth edge, a second connecting portion, a third bonding pad, a fourth bonding pad, and second solid-state semiconductor light sources. A first connecting device is electrically connected to the first bonding pad and the fourth bonding pad; a second connecting device is electrically connected to the second bonding pad and the third bonding pad to fix the first substrate and the second substrate.

6 Claims, 6 Drawing Sheets

LIGHT BAR ASSEMBLY

BACKGROUND OF THE INVENTION

1. Field of the Invention

The present invention relates to a light bar assembly; in particularly, the present invention relates to a light bar assembly, which can effectively utilize space and improve lighting effect.

2. Description of the Prior Art

Light bar using light-emitting diodes (LEDs) is widely applied to LED illumination products and also serves as one of the key components of the backlight module. In the manufacture process of light bar, the soldering method and the LED arrangement will influence the lighting effect of product.

Figure 1A:
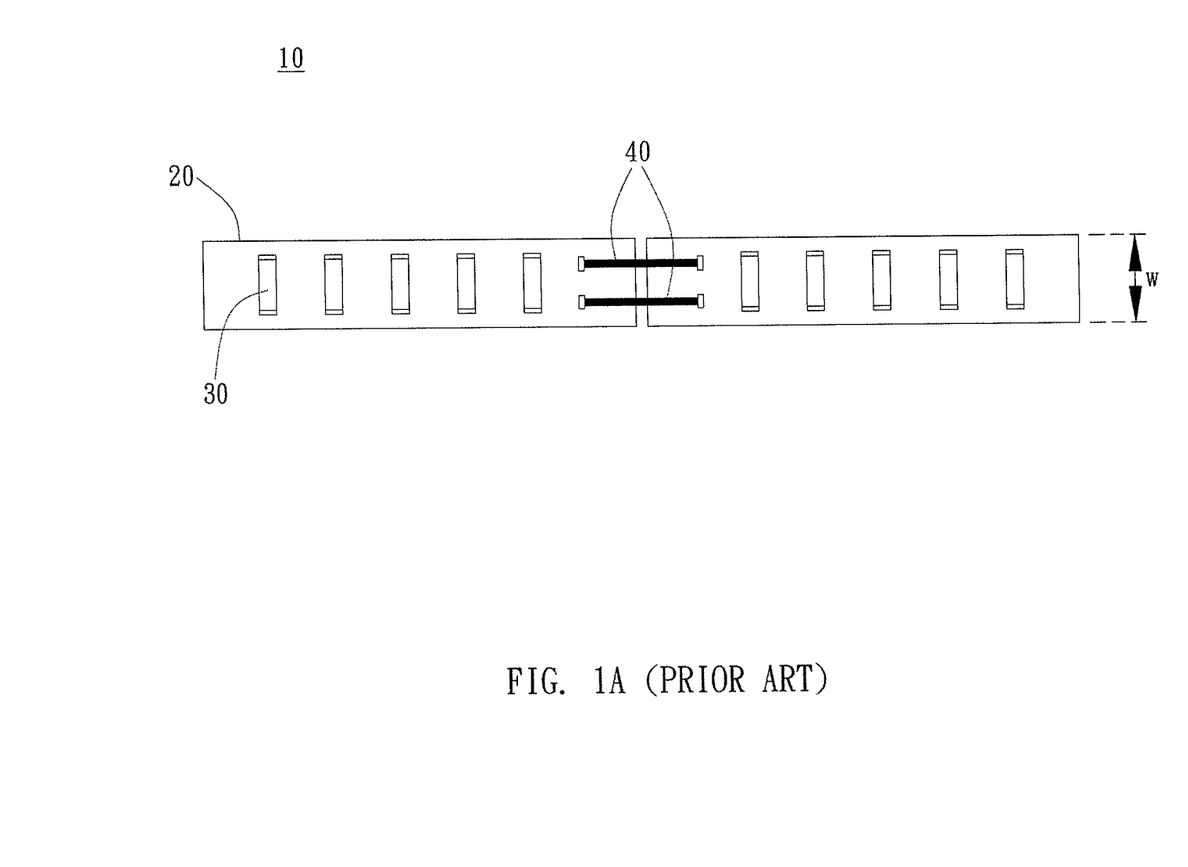
FIG. 1A is a schematic view of a structure of a traditional light bar.

FIG. 1A is a schematic view of the structure of a traditional light bar. As shown in FIG. 1A, a light bar 10 includes a substrate 20 and light sources 30. Light sources 30 on the substrate 20 are arranged in a predetermined interval; however, when the substrates 20 are soldered, light sources 30 on different substrates 20 must spare a room in the arranging direction for disposing a bonding material 40. As such, light sources 30 at the center part of the substrate 20 has a dense arrangement and light sources 30 at the connecting part of the substrate 20 has a sparse arrangement. Accordingly, when testing light uniformity of the light bar 10, dark lines will occur because light intensity at the center part of the substrate 20 is higher than light intensity at the connecting part of the substrate 20.

Figure 1B:
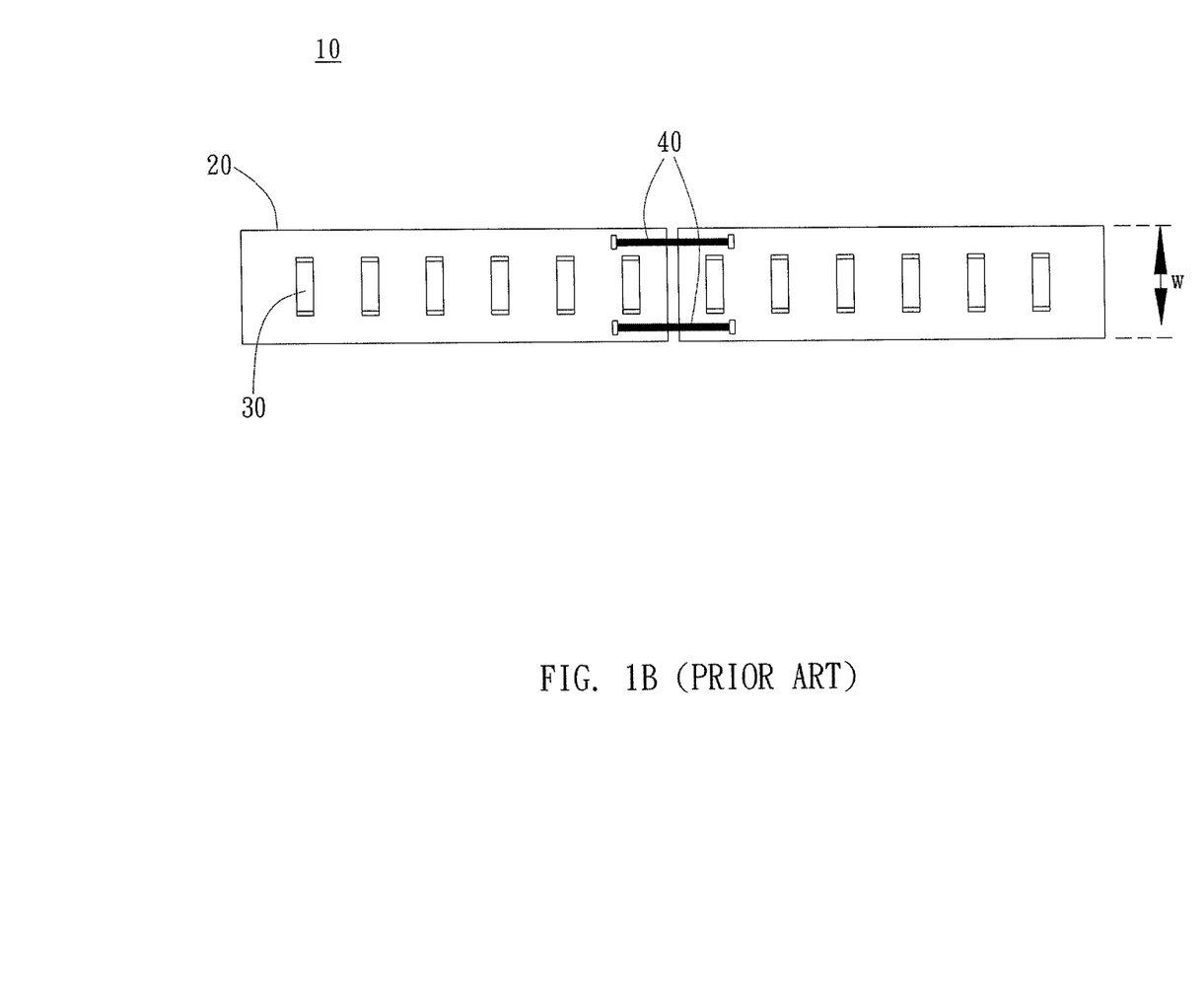
FIG. 1B is a schematic view of another structure of a traditional light bar.

Traditionally, in order to solve the problem mentioned above, a width-expending method is adopted for soldering (as shown in FIG. 1B), i.e. the width (w) of the substrate 20 is expanded and the bonding material 40 is disposed at two ends of the substrate 20 in the expanding direction of the width (w) of the substrate 20. As such, intervals between light sources 30 at the center part of the substrate 20 and those at the connecting part of the substrate 20 are the same. However, the cost will be increased because of the expanded width (w). Therefore, the present invention provides a light bar assembly without increasing cost to improve the dark-line phenomenon and solve the aforementioned problems.

SUMMARY OF THE INVENTION

It is an object of the present invention to provide a light bar assembly, which can effectively utilize space and improve lighting effect.

A first substrate of a light bar assembly includes a first edge and a second edge parallel to each other along a first direction. A first connecting end includes a first connecting portion and a second connecting portion, wherein the first connecting portion protrudes further outward than the second connecting portion. A first bonding pad and a second bonding pad are disposed on the first substrate. First solid-state semiconductor light sources are disposed along the first edge and the second edge. A second substrate, disposed corresponding to the first substrate, includes a third edge, a fourth edge, a second connecting portion, a third bonding pad, a fourth bonding pad, and second solid-state semiconductor light sources. A first connecting device is electrically connected to the first bonding pad and the fourth bonding pad and a second connecting device is electrically connected to the second bonding pad and the third bonding pad to fix the first substrate and the second substrate.

The advantages and the features of the present invention will be described in the following description and will be learned in the drawings therewith.

DETAILED DESCRIPTION OF THE PREFERRED EMBODIMENT

Figure 2:
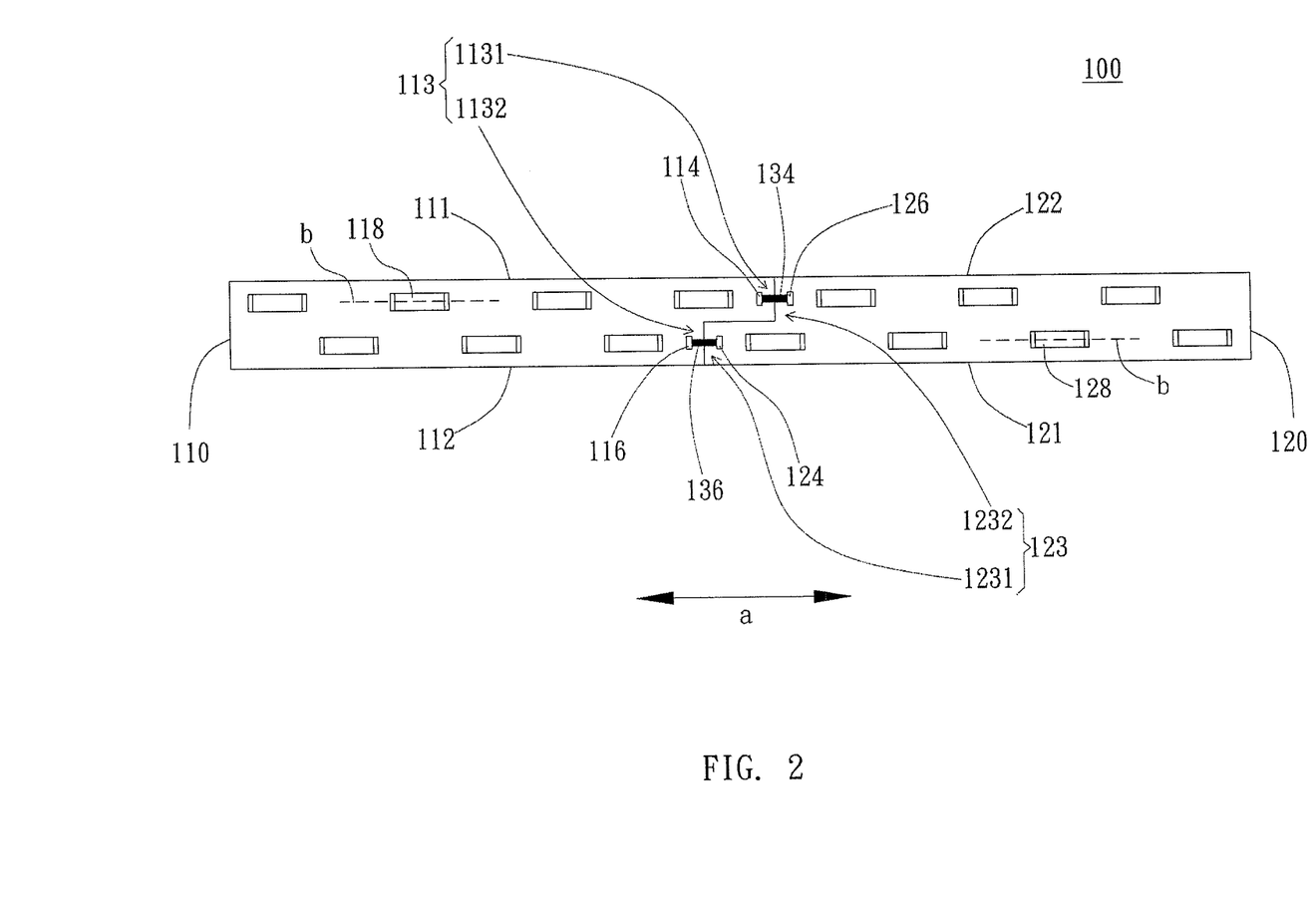
FIG. 2 is a schematic view of an embodiment of a light bar assembly of the present invention.

FIG. 2 is a schematic view of an embodiment of a light bar assembly 100 of the present invention. The light bar assembly 100 may be applied to products utilizing light emitting diodes such as lamps or a backlight module. As shown in FIG. 2, the light bar assembly 100 mainly includes a first substrate 110 and a second substrate 120. The first substrate 110 and the second substrate 120 may be Printed Circuit Board (PCB), Flexible Print Circuit Board (FPCB), glasses, or other materials. The first substrate 110 includes a first edge 111 and a second edge 112 that are parallel to each other and arranged along a first direction (a) as the longer side. A first connecting end 113 is connected to the first edge 111 and the second edge 112. The first connecting end 113 has a first connecting portion 1131 and a second connecting portion 1132. The edge of the first connecting portion 1131 protrudes further outward than the edge of the second connecting portion 1132. In this embodiment, the second edge 112 retreats backward with respect to the first edge 111 in the first direction (a) so that the first connecting portion 1131 and the second connecting portion 1132 form a step profile. A first bonding pad 114 is disposed on the first connecting portion 1131 near the first edge 111 and a second bonding pad 116 is disposed on the second connecting portion 1132 near the second edge 112. In addition, first solid-state semiconductor light sources 118 are disposed from the first bonding pad 114 and the second bonding pad 116 in an interval along the first direction (a). Because the second edge 112 retreats backward with respect to the first edge 111 along the first direction (a), the first solid-state semiconductor light sources 118 disposed beside the first bonding pad 114 are interlaced with the first solid-state semiconductor light sources 118 disposed beside the second bonding pad 116. That is, the first solid-state semiconductor light sources 30 are interlacedly disposed in two rows on the first substrate 110. The first solid-state semiconductor light source 118 on the first connecting portion 1131 and near the first bonding pad 114 partially overlaps the second bonding pad 116 in the direction perpendicular to the first direction (a). In other words, the portion of the first solid-state semiconductor light source 118 at the first connecting portion 1131 is aligned to the second bonding pad 116.

Similarly, the second substrate 120 includes a third edge 121 and a fourth edge 122 that are parallel to each other and arranged along a first direction (a). A second connecting end 123 is connected to the third edge 121 and the fourth edge 122, wherein the second connecting end 123 has a third connecting portion 1231 and a fourth connecting portion 1232. The edge of the third connecting portion 1231 protrudes further outward than the edge of the fourth connecting portion 1232. That is, the fourth edge 122 retreats backward with respect to the third edge 121 in the first direction (a) so that the third connecting portion 1231 and the fourth connecting portion 1232 form a step profile. A third bonding pad 124 is disposed on the third connecting portion 1231 near the third edge 121 and a fourth bonding pad 126 is disposed on the fourth connecting portion 1232 near the fourth edge 122. In addition, second solid-state semiconductor light sources 128 are disposed from the third bonding pad 124 and the fourth bonding pad 126 in an interval along the first direction (a). Because the fourth edge 122 retreats backward with respect to the third edge 121 along the first direction (a), the second solid-state semiconductor light sources 128 disposed beside the third bonding pad 124 are interlaced with the second solid-state semiconductor light sources 128 disposed beside the fourth bonding pad 126. That is, the second solid-state semiconductor light sources 128 are interlacedly disposed in two rows on the second substrate 120. The second solid-state semiconductor light source 128 on the third connecting portion 1231 and near the third bonding pad 124 partially overlaps the fourth bonding pad 126 in the direction perpendicular to the first direction (a). In other words, the portion of the second solid-state semiconductor light source 128 at the third connecting portion 1231 is aligned to the fourth bonding pad 126.

The first substrate 110 and the second substrate 120 are connected to each other via a first connecting device 134 and a second connecting device 136. The first connecting device 134 is electrically connected to the first bonding pad 114 and the fourth bonding pad 126; the second connecting device 136 is electrically connected to the second bonding pad 116 and the third bonding pad 124. The first connecting device 134, the first bonding pad 114, and the fourth bonding pad 126 overlap the second solid-state semiconductor light source 128 closest to the third bonding pad 124. That is, the position of the second solid-state semiconductor light source 128 closest to the third bonding pad 124 corresponds to the position of the first connecting device 134 and the bonding pads connected thereto in the direction perpendicular to the first direction (a). Similarly, the second connecting device 136, the second bonding pad 116, and the third bonding pad 124 overlap the first solid-state semiconductor light source 118 closest to the first bonding pad 114. That is, the position of the first solid-state semiconductor light source 118 closest to the first bonding pad 114 corresponds to the position of the second connecting device 136 and the bonding pads connected thereto in the direction perpendicular to the first direction (a).

The aforementioned connecting method can be soldering or other adhesive methods. The first connecting device 134 and the second connecting device 136 can be conducting wires or connectors. The first connecting portion 1131 and the second connecting portion 1132 respectively connect the fourth connecting portion 1232 and the third connecting portion 1231 by the first connecting device 134 and the second connecting device 136 to form a complementary light bar assembly 100. In this embodiment, the first solid-state semiconductor light source 118 and the second solid-state semiconductor light source 128 are LEDs, wherein the wavelength of light sources can be the same or different. Besides, Both the first solid-state semiconductor light source 118 and the second solid-state semiconductor light source 128 have a longitudinal axis (b) arranged along the first direction (a), but not limited to. For example, the longitudinal axis (b) can be nonparallel to the first direction (a), so that the first solid-state semiconductor light source 118 and the second solid-state semiconductor light source 128 are arranged in an inclined manner. By means of the design of step profile mentioned above, the space utilization is much more effective and the first solid-state semiconductor light source 118 and the second solid-state semiconductor light source 128 are disposed interlacedly. In addition, by adjusting the positions where the first connecting device 134 and the second connecting device 136 connect the first substrate 110 and the second substrate 120, dark-line phenomenon can be improved and the width of substrates needs not to be increased to save the cost.

Figure 3:
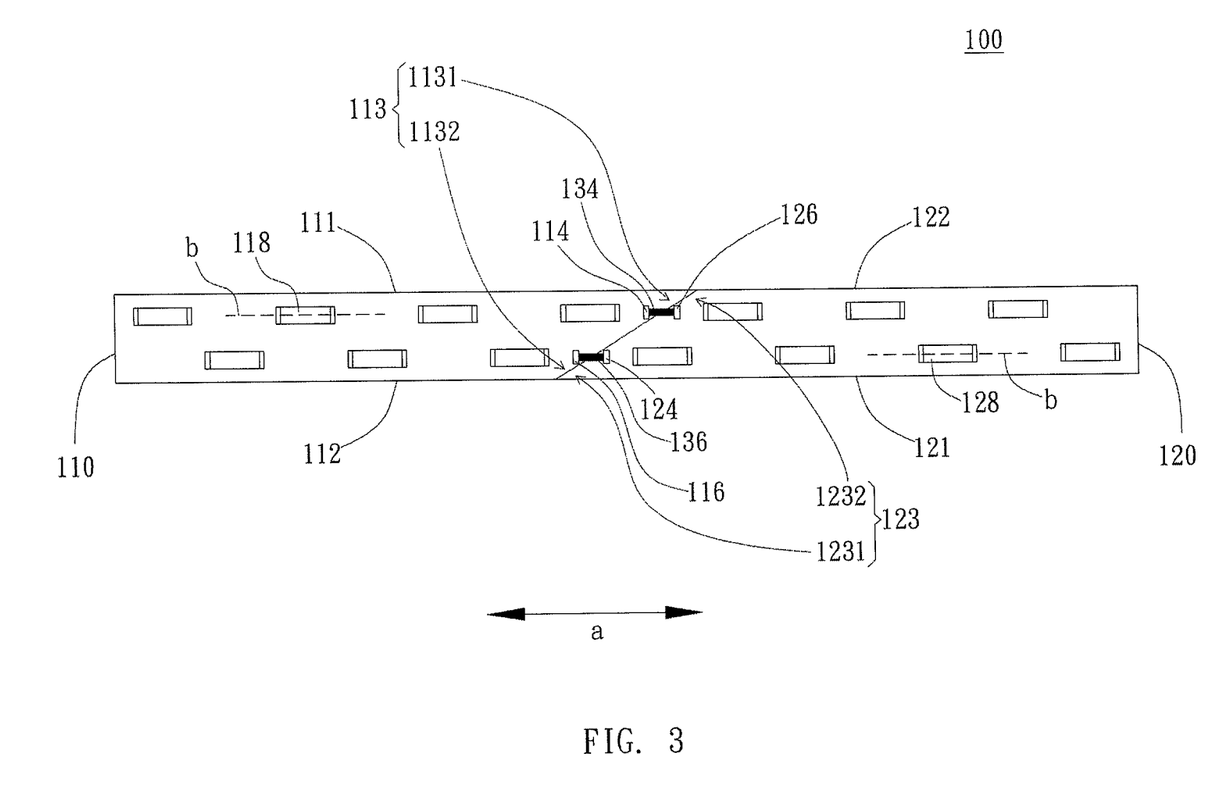
FIG. 3 is a schematic view of another embodiment of the light bar assembly of the present invention.

FIG. 3 is a schematic view of another embodiment of the light bar assembly of the present invention. As shown in FIG. 3, the first connecting end 113 and the second connecting end 123 of the light bar assembly 100 are complementary inclined faces or inlay faces. Specifically, the first connecting end 113 has a first connecting portion 1131 and a second connecting portion 1132. The edge of the first connecting portion 1131 protrudes further outward than the edge of the second connecting portion 1132. In this embodiment, the second edge 112 moves backward from the first edge 111 along the first direction (a) so that the first connecting portion 1131 and the second connecting portion 1132 form an inclination profile. The first bonding pad 114 is disposed on the first connecting portion 1131 near the first edge 111 and the second bonding pad 116 is disposed the second connecting portion 1132 near the second edge 112. In addition, first solid-state semiconductor light sources 118 are disposed from the first bonding pad 114 and the second bonding pad 116 in an interval along the first direction (a). Because the second edge 112 moves backward from the first edge 111 along the first direction (a), the first solid-state semiconductor light sources 118 disposed beside the first bonding pad 114 are interlaced with the first solid-state semiconductor light sources 118 disposed beside the second bonding pad 116. That is, the first solid-state semiconductor light sources 118 are disposed interlacedly on the first substrate 110. The first solid-state semiconductor light source 118 on the first connecting portion 1131 and near the first bonding pad 114 partially overlaps the second bonding pad 116 in the direction perpendicular to the first direction (a). In other words, the portion of the first solid-state semiconductor light source 118 at the first connecting portion 1131 is aligned to the second bonding pad 116.

Similarly, the second connecting end 123 of the second substrate 120 has a third connecting portion 1231 and a fourth connecting portion 1232. The edge of the third connecting portion 1231 protrudes further outward than the edge of the fourth connecting portion 1232. That is, the fourth edge 122 moves backward from the third edge 121 along the first direction (a) so that the third connecting portion 1231 and the fourth connecting portion 1232 form an inclination profile. The third bonding pad 124 is disposed on the third connecting portion 1231 near the third edge 121 and a fourth bonding pad 126 is disposed on the fourth connecting portion 1232 near the fourth edge 122. In addition, second solid-state semiconductor light sources 128 are disposed from the third bonding pad 124 and the fourth bonding pad 126 in an interval along the first direction (a). Because the fourth edge 122 moves backward from the third edge 121 along the first direction (a), the second solid-state semiconductor light sources 128 disposed beside the third bonding pad 124 are interlaced with the second solid-state semiconductor light sources 128 disposed beside the fourth bonding pad 126. That is, the second solid-state semiconductor light sources 128 are disposed interlacedly on the second substrate 120. The second solid-state semiconductor light source 128 on the third connecting portion 1231 and near the third bonding pad 124 partially overlaps the fourth bonding pad 126 in the direction perpendicular to the first direction (a). In other words, the portion of the second solid-state semiconductor light source 128 at the third connecting portion 1231 is aligned to the fourth bonding pad 126.

The first substrate 110 and the second substrate 120 have end faces in complementary shape for connection. The first connecting device 134 is electrically connected to the first bonding pad 114 and the fourth bonding pad 126. The second connecting device 136 is electrically connected to the second bonding pad 116 and the third bonding pad 124. The projection of the first connecting device 134, the first bonding pad 114, and the fourth bonding pad 126 in the direction perpendicular to the first direction (a) overlaps the second solid-state semiconductor light source 128 closest to the third bonding pad 124. That is, the position of the second solid-state semiconductor light source 128 closest to the third bonding pad 124 corresponds to the position of the first connecting device 134 and the bonding pads connected thereto in the direction perpendicular to the first direction (a). Similarly, the projection of the second connecting device 136, the second bonding pad 116, and the third bonding pad 124 in the direction perpendicular to the first direction (a) overlaps the first solid-state semiconductor light source 118 closest to the first bonding pad 114. That is, the position of the first solid-state semiconductor light source 118 closest to the first bonding pad 114 corresponds to the position of the second connecting device 136 and the bonding pads connected thereto in the direction perpendicular to the first direction (a).

The aforementioned connecting method can be soldering or other methods. The first connecting device 134 and the second connecting device 136 can be conducting wires or connectors. The first connecting portion 1131 and the second connecting portion 1132 respectively connect the fourth connecting portion 1232 and the third connecting portion 1231 to form a complementary light bar assembly 100. In this embodiment, the first solid-state semiconductor light source 118 and the second solid-state semiconductor light source 128 are LEDs, wherein the wavelength of light sources can be the same or different. Besides, Both the first solid-state semiconductor light source 118 and the second solid-state semiconductor light source 128 have a longitudinal axis (b) arranged along the first direction (a), but not limited to. For example, the longitudinal axis (b) can be nonparallel to the first direction (a), so that the first solid-state semiconductor light source 118 and the second solid-state semiconductor light source 128 are arranged in an inclined manner.

Figure 4:
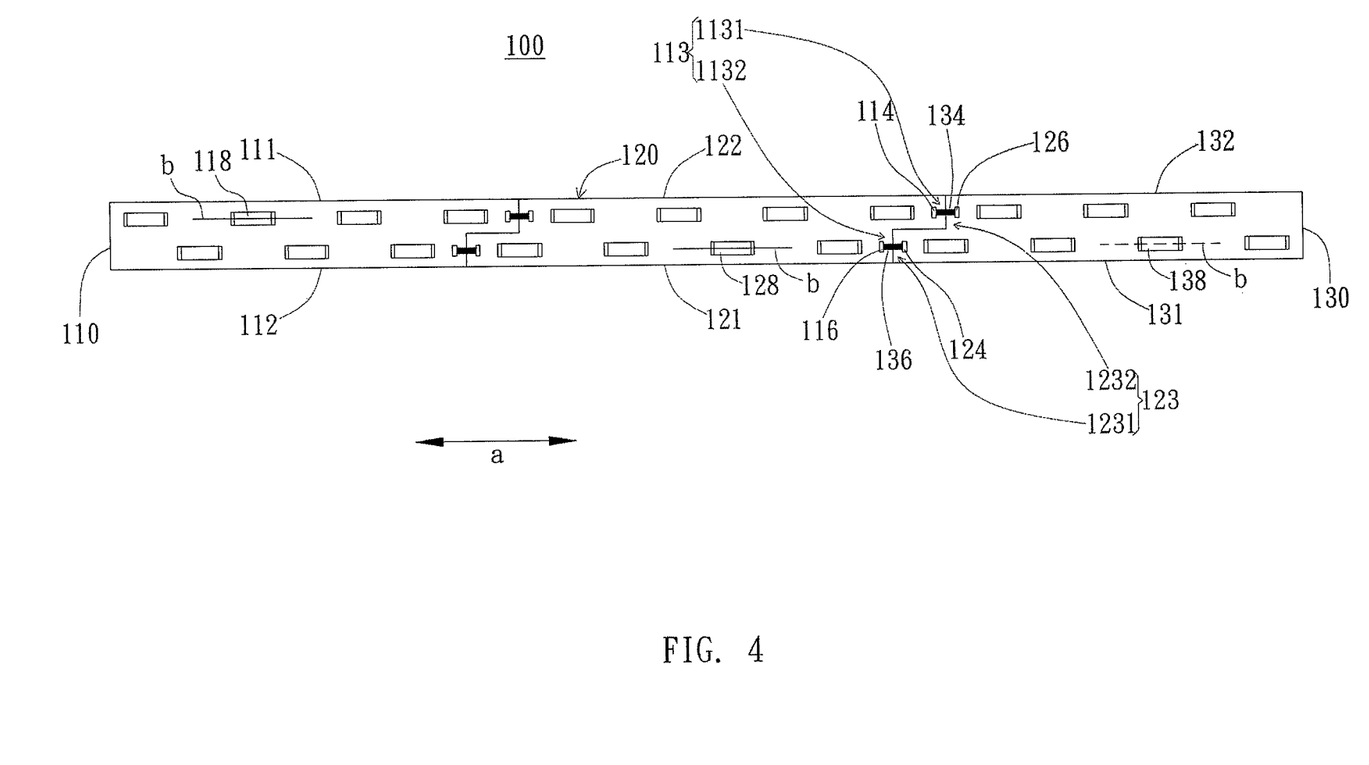
FIG. 4 is a schematic view of another embodiment of the light bar assembly in FIG. 2.
Figure 5:
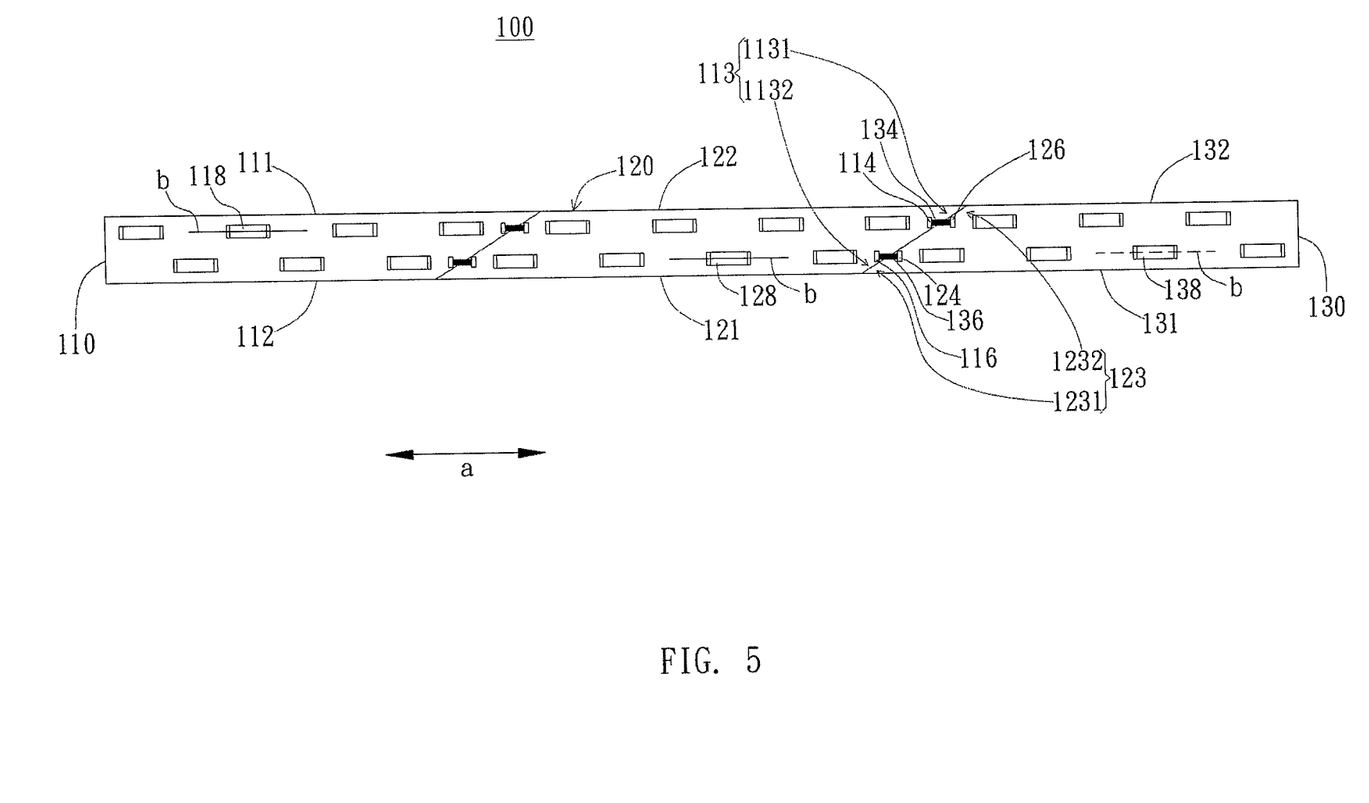
FIG. 5 is a schematic view of another embodiment of the light bar assembly in FIG. 1.

Besides, the size of the light bar assembly 100 may be adjusted according to the practical required length. FIG. 4 and FIG. 5 are schematic views of another embodiments of the light bar assembly 100 in FIG. 2 and FIG. 3, respectively. As shown in FIG. 4, the other side of the second substrate 120 and the third substrate 130 are in complementary shape and engaged to each other. The first connecting device 134 is electrically connected to the first bonding pad 114 and the fourth bonding pad 126. The second connecting device 136 is electrically connected to the second bonding pad 116 and the third bonding pad 124. The projection of the first connecting device 134, the first bonding pad 114, and the fourth bonding pad 126 in the direction perpendicular to the first direction (a) overlaps the third solid-state semiconductor light source 138 closest to the third bonding pad 124. That is, the position of the third solid-state semiconductor light source 138 closest to the third bonding pad 124 corresponds to the position of the first connecting device 134 and the bonding pads connected thereto in the direction perpendicular to the first direction (a). Similarly, the projection of the second connecting device 136, the second bonding pad 116, and the third bonding pad 124 in the direction perpendicular to the first direction (a) overlaps the second solid-state semiconductor light source 128 closest to the first bonding pad 114. That is, the position of the second solid-state semiconductor light source 128 closest to the first bonding pad 114 corresponds to the position of the second connecting device 136 and the bonding pads connected thereto in the direction perpendicular to the first direction (a). The first connecting portion 1131 and the second connecting portion 1132 respectively connect the fourth connecting portion 1232 and the third connecting portion 1231 to form a complementary light bar assembly 100. The embodiment shown in FIG. 5 illustrates that the first connecting end 113 of the second substrate 120 and the second connecting end 123 of the third substrate 130 are complementary inclined faces or inlay faces connected by the aforementioned method and will not elaborate hereinafter.

By such a non-planar design, such as the step profile or the inclination profile, the space utilization is much more effective. By adjusting the positions where the first connecting device 134 and the second connecting device 136 connect the first substrate 110 and the second substrate 120 and by adjusting the arrangement of the first solid-state semiconductor light sources 118 and the second solid-state semiconductor light sources 128, dark-line phenomenon can be improved and the width of substrates needs not to be increased to save the cost.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A light bar assembly, comprising:
a first substrate, comprising:
 a first edge and a second edge parallel to each other and arranged along a first direction;
 a first connecting end connected to the first edge and the second edge, the first connecting end having a first connecting portion and a second connecting portion, the edge of the first connecting portion protruding further outward than the edge of the second connecting portion;
 a first bonding pad and a second bonding pad disposed on the first substrate, wherein the first bonding pad and the second bonding pad are disposed near the edge of the first connecting portion and the edge of the second connecting portion, respectively; and
 a plurality of first solid-state semiconductor light sources disposed interlacedly on the first substrate along the first edge and the second edge, wherein at least one first solid-state semiconductor light source is located beside the first bonding pad of the first connecting portion and partially overlaps the second bonding pad, and at least one first solid-state semiconductor light source is located beside the second bonding pad of the second connecting portion;
a second substrate, comprising:
 a third edge and a fourth edge parallel to each other and arranged along a first direction;
 a second connecting end connected to the third edge and the fourth edge, the second connecting end having a third connecting portion and a fourth connecting portion, the edge of the third connecting portion protruding further outward than the edge of the fourth connecting portion;

a third bonding pad and a fourth bonding pad disposed on the second substrate, wherein the third bonding pad and the fourth bonding pad are disposed near the edge of the third connecting portion and the edge of the fourth connecting portion, respectively; and a plurality of second solid-state semiconductor light sources disposed interlacedly on the second substrate along the third edge and the fourth edge, wherein at least one second solid-state semiconductor light source is located beside the third bonding pad of the third connecting portion and partially overlaps the fourth bonding pad and at least one second solid-state semiconductor light source is located beside the fourth bonding pad of the fourth connecting portion.

a first connecting device electrically connected to the first bonding pad and the fourth bonding pad, wherein the first connecting device, the first bonding pad, and the fourth bonding pad overlap the second solid-state semiconductor light source closest to the third bonding pad; and a second connecting device electrically connected to the second bonding pad and the third bonding pad, wherein the second connecting device, the second bonding pad, and the third bonding pad overlap the first solid-state semiconductor light source closest to the first bonding pad;

wherein the first connecting portion and the second connecting portion of the first substrate complementarily join the fourth connecting portion and the third connecting portion of the second substrate to form a light bar assembly.

2. The light bar assembly of claim 1, wherein the first connecting end and the second connecting end are complementary inclined faces or inlay faces.

3. The light bar assembly of claim 2, wherein the first solid-state semiconductor light sources and the second solid-state semiconductor light sources are light emitting diodes.

4. The light bar assembly of claim 3, wherein the first solid-state semiconductor light sources and the second solid-state semiconductor light sources each has a longitudinal axis arranged along the first direction.

5. The light bar assembly of claim 1, wherein the first connecting device and the second connecting device are conducting wires or connectors.

6. The light bar assembly of claim 5, wherein the wavelength of the first solid-state semiconductor light sources and the wavelength of the second solid-state semiconductor light sources are the same or different.

* * * * *